(12) United States Patent
Sugimoto et al.

(10) Patent No.: US 8,300,419 B2
(45) Date of Patent: Oct. 30, 2012

(54) ELECTRONIC CIRCUIT DEVICE AND METHOD OF MAKING THE SAME

(75) Inventors: Keiichi Sugimoto, Kariya (JP); Mitsuru Nakagawa, Chiryu (JP)

(73) Assignee: Denso Corporation, Kariya (JP)

( * ) Notice: Subject to any disclaimer, the term of this patent is extended or adjusted under 35 U.S.C. 154(b) by 679 days.

(21) Appl. No.: 12/243,189

(22) Filed: Oct. 1, 2008

(65) Prior Publication Data

US 2009/0086445 A1 Apr. 2, 2009

(30) Foreign Application Priority Data

Oct. 1, 2007 (JP) ................................. 2007-257841

(51) Int. Cl.
*H05K 7/00* (2006.01)
(52) U.S. Cl. ........ 361/760; 361/737; 361/764; 174/260; 174/521; 257/687; 257/787
(58) Field of Classification Search .................. 361/760, 361/737, 764; 174/260, 521; 257/768, 687, 257/787
See application file for complete search history.

(56) References Cited

U.S. PATENT DOCUMENTS

| 5,371,404 | A  | * | 12/1994 | Juskey et al. ............... 257/659 |
| 6,104,093 | A  | * | 8/2000  | Caletka et al. ............. 257/778 |
| 6,282,781 | B1 |   | 9/2001  | Gotoh et al. |
| 6,285,086 | B1 |   | 9/2001  | Sota et al. |
| 6,546,620 | B1 | * | 4/2003  | Juskey et al. ................ 29/840 |
| 6,700,209 | B1 | * | 3/2004  | Raiser et al. ................. 257/790 |
| 7,547,579 | B1 | * | 6/2009  | Jiang ............................ 438/118 |
| 2006/0099390 | A1 | * | 5/2006 | Sugiyama et al. ............ 428/209 |
| 2006/0252384 | A1 |   | 11/2006 | Sugimoto et al. |
| 2007/0161269 | A1 |   | 7/2007 | Sugimoto et al. |
| 2007/0279877 | A1 | * | 12/2007 | Dobritz et al. ............... 361/760 |

FOREIGN PATENT DOCUMENTS

| JP | 3-156941    | 7/1991  |
| JP | 6-61304     | 3/1994  |
| JP | 7-142536    | 6/1995  |
| JP | 10-270497   | 10/1998 |
| JP | 2001-326237 | 11/2001 |
| JP | 2002-016104 | 1/2002  |
| JP | 2004-55609  | 2/2004  |
| JP | 2004-118511 | 4/2004  |
| JP | 2005-026447 | 1/2005  |

OTHER PUBLICATIONS

U.S. Appl. No. 12/243,217 of Sugimoto et al. filed Oct. 1, 2008.
U.S. Appl. No. 12/243,243 of Sugimoto et al. filed Oct. 1, 2008.
Chinese Office Action dated Mar. 24, 2010, issued in corresponding Chinese Application No. 200810169531.8, with English translation.

(Continued)

*Primary Examiner* — Hoa C Nguyen
(74) *Attorney, Agent, or Firm* — Nixon & Vanderhye PC

(57) ABSTRACT

A method of making an electronic circuit device includes expelling air from a gap between a circuit board and an electronic element mounted on only a first side of the circuit board by filling the gap with a filling member, placing the circuit board in a mold cavity such that a second side of the circuit board is held in close contact with an inner surface of the cavity. The method further includes encapsulating the circuit board with a resin material by injecting the resin material into the cavity.

4 Claims, 4 Drawing Sheets

OTHER PUBLICATIONS

Japanese Office Action dated Jan. 26, 2010, issued in corresponding Japanese Application No. 2007-257841, with English translation.
Japanese Office Action dated Apr. 27, 2010, issued in corresponding Japanese Application No. 2007-257841, with English translation.
Chinese Office Action dated Jul. 20, 2011, issued in corresponding Chinese Application No. 200810169531.8, with English translation.
Chinese Office Action dated Apr. 28, 2012, issued in corresponding Chinese Application No. 200810169531.8, with English translation.

* cited by examiner

US 8,300,419 B2

ELECTRONIC CIRCUIT DEVICE AND METHOD OF MAKING THE SAME

CROSS REFERENCE TO RELATED APPLICATION

This application is based on and incorporates herein by reference Japanese Patent Application No. 2007-257841 filed on Oct. 1, 2007.

FIELD OF THE INVENTION

The present invention relates to an electronic circuit device and method of making the electronic circuit device.

BACKGROUND OF THE INVENTION

US 2007/0161269 corresponding to JP-A-2006-303327 discloses an electronic circuit device configured as an electronic key transceiver. The electronic circuit device includes a circuit board having first and second sides opposite each other. Electronic elements are mounted on only the first side of the circuit board. The circuit board is encapsulated in a casing in such a manner that the second side of the circuit board is exposed to an outer surface of the casing. Thus, the second side of the circuit board defines part of the outer surface of the casing.

A method of making the electronic circuit device includes a placing process and an encapsulating process subsequent to the placing process. In the placing process, the circuit board is placed in a cavity of a mold (i.e., die) in such a manner that the second side of the circuit board can be held in close contact with an inner surface of the cavity. In the encapsulating process, a liquid resin material is injected under pressure into the cavity of the mold and then cured (i.e., solidified).

Since the circuit board is held in close contact with the inner surface of the cavity, the circuit board can be prevented from being greatly deformed by pressure and heat, which are applied to the circuit board in the encapsulating process.

In the method described above, after the resin material is injected into the cavity, air may be trapped in a gap between the electronic element and the circuit board. The air trapped in the gap may expand due to the pressure and heat and cause a bulge (bump or the like) on the second side of the circuit board. Since the second side of the circuit board is exposed to the outer surface of the casing, the bulge mars the appearance of the electronic key transceiver.

SUMMARY OF THE INVENTION

In view of the above-described problem, it is an object of the present invention to provide an electronic circuit device and method of making the electronic circuit device to prevent a bulge from appearing on an exposed surface of a circuit board.

According to an aspect of the present invention, a method of making an electronic circuit device includes expelling air from a gap between a circuit board and an electronic element mounted on only a first side of the circuit board by filling the gap with a filling member, placing the circuit board in a cavity of a mold such that a second side of the circuit board is held in close contact with an inner surface of the cavity. The first and second sides of the circuit board are opposite each other. The method further includes encapsulating the circuit board and the electronic element in a casing by filling the cavity with a liquid resin material. The casing has a substantially card shape. The second side of the circuit board is exposed to an outer surface of the casing to define part of the outer surface of the casing.

According to another aspect of the present invention, an electronic circuit device includes a circuit board having first and second sides opposite each other, an electronic element mounted on only the first side of the circuit board, a resin casing having a substantially card shape and configured to encapsulate the circuit board and the electronic element such that the second side of the circuit board is exposed to an outer surface of the casing to define part of the outer surface of the casing, and a filling member configured to fill a gap between the circuit board and the electronic element so that air is expelled from the gap.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 3:
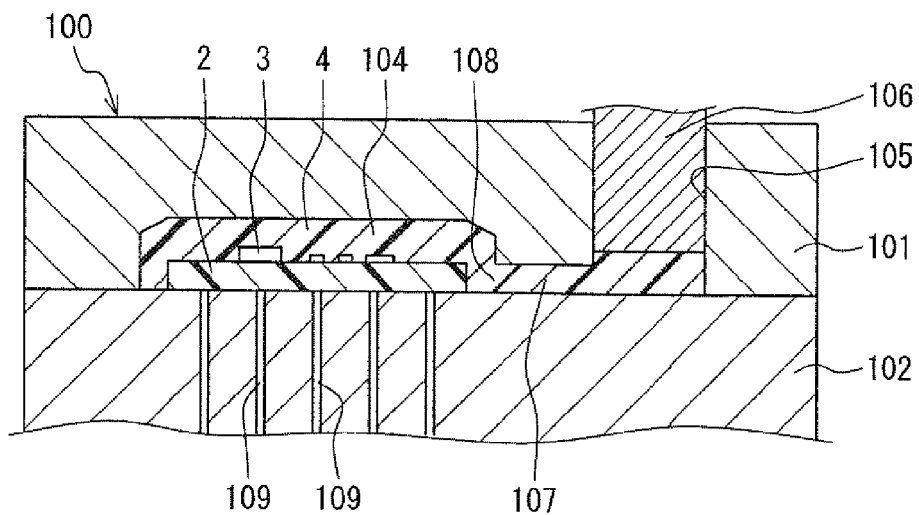
FIG. 3 is a diagram illustrating a cross-sectional view of an encapsulating process of the method of making the electronic key transceiver.
Figure 4:
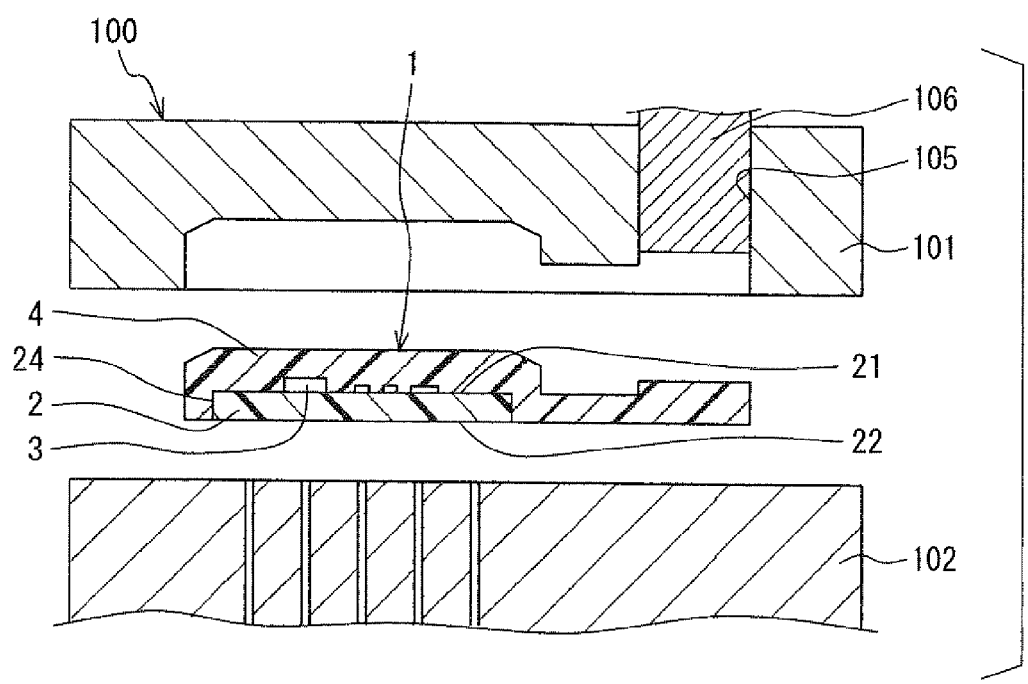
FIG. 4 is a diagram illustrating a cross-sectional view of a removing process of the method of making the electronic key transceiver.
Figure 5:
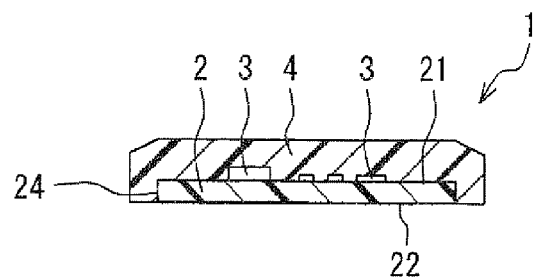
FIG. 5 is a diagram illustrating a cross-sectional view of the electronic key transceiver.

An electronic key transceiver 1 according to an embodiment of the present invention is described below with reference to FIGS. 1-6C. FIG. 5 illustrates the electronic key transceiver 1 as a finished product. The electronic key transceiver 1 includes a circuit board 2, an electronic element 3 mounted on the circuit board 2, and a casing 4 made of a resin material. For example, the electronic key transceiver 1 can be used in a vehicle electronic key system and designed to be carried by a driver.

Figure 1:
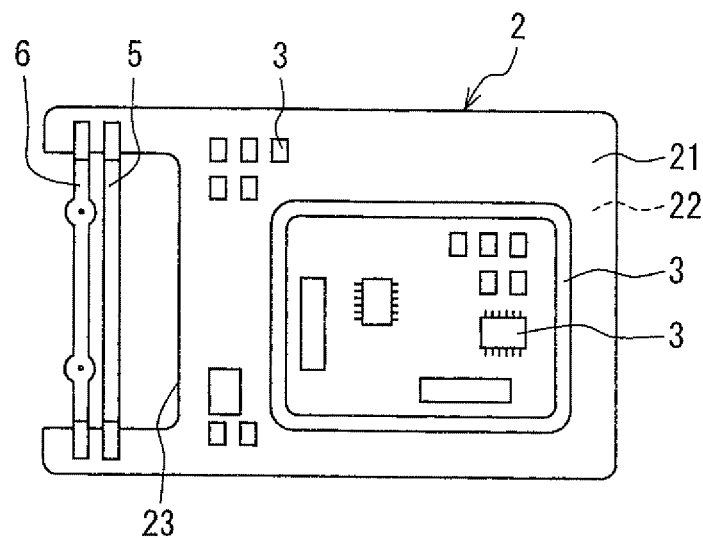
FIG. 1 is a diagram illustrating a top view of a circuit board of an electronic key transceiver according to an embodiment of the present invention.

As illustrated in detail in FIG. 1, positive and negative terminals 5, 6 are soldered to the circuit board 2. The circuit board 2, the electronic element 3, and solder joints between each of the positive and negative terminals 5, 6 and the circuit board 2 are encapsulated in the casing 4.

The circuit board 2 can be made, for example, by forming an electrical conductor trace pattern (e.g., copper foil) to an electrical insulator base such as a glass epoxy board. In the embodiment, the circuit board 2 employs a glass-reinforced epoxy board as the base. Alternatively, the base of the circuit board can be a board other than a glass-reinforced epoxy board.

The circuit board 2 has first and second sides 21, 22 opposite each other. The electronic element 3 is mounted on only the first side 21 of the circuit board 2 so that the second side 22 of the circuit board 2 can be flat. An example of the electronic element 3 can be a resistor, a capacitor, a diode, a transistor, an integrated circuit (IC) module, an antenna, or the like.

The circuit board 2 has a cutout 23 that defines a battery space where a battery (not shown) is accommodated. For example, the battery can be a button-type battery. The positive terminal 5 spans the cutout 23 and is soldered to the trace pattern of the circuit board 2 at each end. Likewise, the negative terminal 6 spans the cutout 23 and is soldered to the trace pattern of the circuit board 2 at each end. When the battery is accommodated in the battery space, positive and negative poles of the battery are in contact with the positive and negative terminals 5, 6, respectively. Thus, the electronic key transceiver 1 can be powered by the battery accommodated in the battery space.

Figure 2:
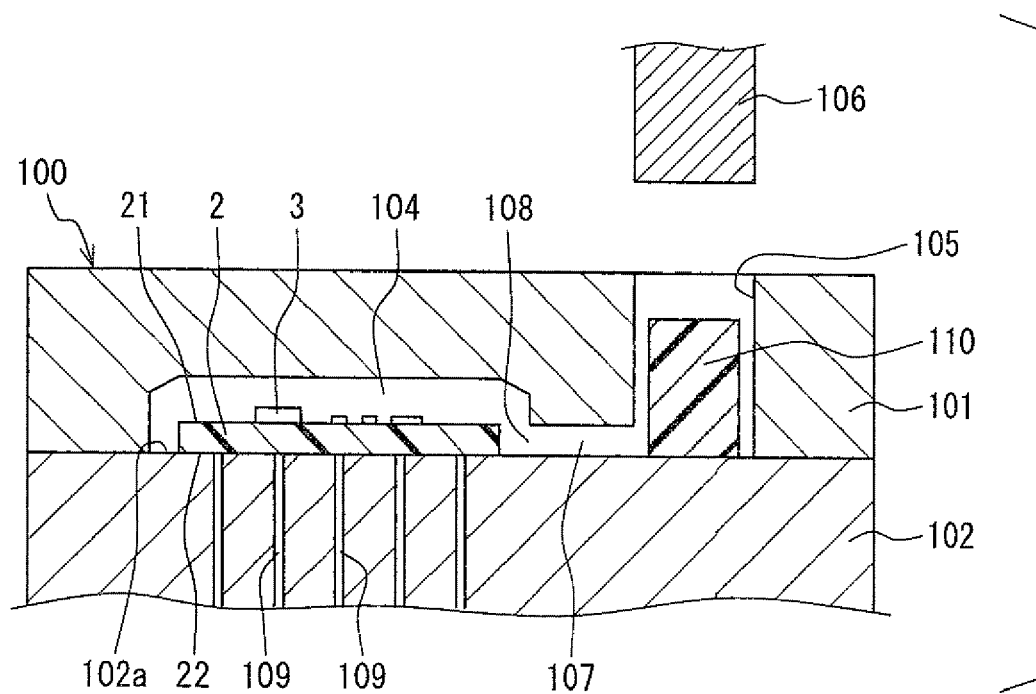
FIG. 2 is a diagram illustrating a cross-sectional view of a placing process of a method of making the electronic key transceiver.

The casing 4 of the electronic key transceiver 1 is made by using a mold 100 (i.e., a die) illustrated in FIG. 2. The circuit board 2, to which the electronic element 3 and the positive and negative terminals 5, 6 are mounded, is placed in a cavity 104 of the mold 100 in such a manner that the second side 22 of the circuit board 2 can be held in close contact with an inner surface of the cavity 104.

The mold 100 includes an upper mold 101, a lower mold 102, and a slide core (not shown). The slide core is sometimes also referred as a "side core". The slide core covers middle portions of the positive and negative terminals 5, 6 to form the battery space. The upper and lower molds 101, 102 are fixed to movable or fixed platens of a molding machine (not shown).

The upper mold 101 of the mold 100 has a sprue (i.e., runner) 107. A pot 105 is located on an upstream side of the sprue 107, and a gate 108 is located on a downstream side of the sprue 107. A plunger 106 (i.e., piston) of the molding machine is located above the pot 105 so that the plunger 106 can enter and exit the pot 105. A tablet 110 as a solid resin material is charged into the pot 105, and then the plunger 106 enters the pot 105. As a result, the tablet 110 can change to a liquid resin material. The liquid resin material flows from the pot 105 to the cavity 104 by passing through the sprue 107 and the gate 108.

The lower mold 102 of the mold 100 has a suction hole 109 exposed to a surface 102a. The suction hole 109 is coupled through a pipe (not shown) to an external suction source (not shown) such as a vacuum pump.

A method of making the electronic key transceiver 1 is described below with reference to FIGS. 2-6C. The method includes an air expelling process illustrated in FIGS. 6A-6C, a placing process subsequent to the expelling process and illustrated in FIG. 2, an encapsulating process subsequent to the placing process and illustrated in FIG. 3, and a removing process subsequent to the encapsulating process and illustrated in FIG. 4.

Firstly, the placing process is described below with reference to FIG. 2. In the placing process, the second side 22 of the circuit board 2 is placed on the surface 102a of the lower mold 102 so that the circuit board 2 can be located on the suction hole 109. Then, the upper mold 101 and the lower mold 102 are assembled and clamped together to form the cavity 104. As a result, the circuit board 2 is located in the cavity 104 of the mold 100. At this time, the suction hole 109 is maintained at negative pressure by the suction source with respect to the cavity 104 so that the second side 22 of the circuit board 2 can be held in close contact with the inner surface of the cavity 104.

Then, the tablet 110 as the resin material for the casing 4 is charged into the pot 105 of the mold 100.

The tablet 110 can be made of thermoset resin. In the embodiment, the tablet 110 is made of epoxy resin. For example, B-stage (i.e., semi-cured) epoxy resin powder is compressed into the tablet 110. The use of the tablet 110 (i.e., the use of solid material instead of liquid material) can improve manufacturability of the electronic key transceiver 1 and also help prevent air bubble from being trapped in the casing 4 of the electronic key transceiver 1. If necessary, the tablet 110 can be preheated before being charged into the pot 105.

A temperature of the mold 100 needs to be adjusted to cause a curing reaction of the epoxy resin. Further, since the electronic element 3 and the positive and negative terminals 5, 6 are joined to the circuit board 2 by solder, the temperature of the mold 100 needs to be less than a melting temperature of the solder. In the embodiment, the solder has a melting temperature of about 240° C., and the epoxy resin has a curing reaction temperature of about 170° C. Therefore, for example, the temperature of the mold 100 can be set to about 200° C.

As describe above, the casing 4 of the electronic key transceiver 1 is made of the epoxy resin. Since the epoxy resin has high heat resistance and high mechanical resistance, the electronic key transceiver 1 can be suitably protected against damage. Therefore, although the electronic key transceiver 1 is carried by the driver at all times, a reliability of the electronic key transceiver 1 can be ensured.

The resin material for the casing 4 of the electronic key transceiver 1 can be a resin material other than epoxy resin, as long as a curing reaction temperature of the resin material is less than a melting temperature of the solder. For example, the resin material can be phenolic resin, unsaturated polyester resin, or the like.

Next, the encapsulating process subsequent to the placing process is described below with reference to FIG. 3. In the encapsulating process, the plunger 106 moves down and enters the pot 105 so that the tablet 110 in the pot 105 can change to a liquid epoxy resin. The liquid epoxy resin is injected into the cavity 104 through the sprue 107 and the gate 108 so that the cavity 104 can be filled with the liquid epoxy resin. The liquid epoxy resin in the cavity 104 receives heat from the mold 100. The heat causes a curing reaction of the liquid epoxy resin. As a result, the liquid epoxy resin is cured and molded into the casing 4. In this way, the circuit board 2 is encapsulated in the casing 4, which is made of the epoxy resin.

Next, the removing process subsequent to the encapsulating process is described below with reference to FIG. 4. In the removing process, the mold 100 is opened, and the circuit board 2 encapsulated in the casing 4 is removed from the mold 100 by using an eject mechanism (not shown) of the molding machine. Then, the casing 4 is cut along the gate 108 to eliminate an unnecessary portion corresponding to the pot 105 and the sprue 107. In this way, the electronic key transceiver 1 shown in FIG. 5 can be made. Since the second side 22 of the circuit board 2 is held in close contact with the inner surface of the cavity 104 during the encapsulating process, the second side 22 of the circuit board 2 is exposed to an outer surface of the casing 4 as shown in FIG. 5.

If necessary, a surface treatment such as painting (coating) is applied to an outer surface of the electronic key transceiver 1. In such an approach, an exposed surface (i.e., second side 22) of the circuit board 2 is painted so that the electronic key transceiver 1 can have a good appearance.

The casing 4 encapsulates the electronic element 3 mounted on the circuit board 2, the first side 21 and a side surface 24 of the circuit board 2, and the solder joints between each of the positive and negative terminals 5, 6 and the circuit board 2. Therefore, circuitry of the electronic key transceiver 1 can be sealed in the casing 4 so that the electronic key transceiver 1 can be made waterproof.

The second side 22 of the circuit board 2 is exposed to the outer surface of the casing 4 and forms a flat continuous surface in conjunction with the outer surface of the casing 4. Thus, the second side 22 of the circuit board 2 defines part of the outer surface of the casing 4.

In the embodiment, the electronic key transceiver 1 has a rectangular shape like a card. For example, the electronic key transceiver 1 can be sized to substantially meet an ID-1 format (85.60×53.98 mm) except for a thickness. The ID-1 format is commonly used for a credit card, a bank card, or the like.

Finally, the expelling process performed prior to the holding process is described below with reference to FIGS. 6A-6C. The expelling process includes an injecting process illustrated in FIG. 6A and a curing process subsequent to the injection process and illustrated in FIG. 6B. In the expelling process, air is expelled from a gap between the circuit board 2 and the electronic element 3 by filling the gap with an underfill member 7.

Figure 6A:
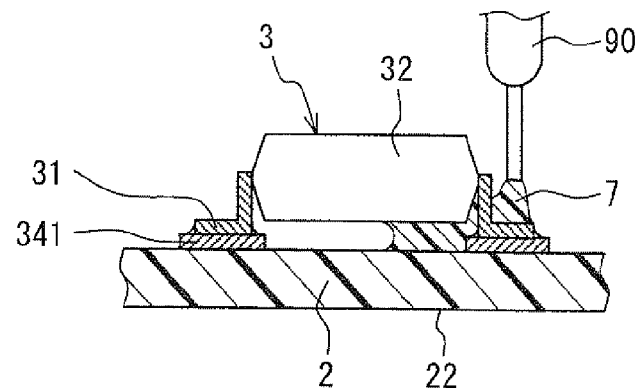
FIG. 6A is a diagram illustrating a cross-sectional view of an injecting process of an expelling process of the method of making the electronic key transceiver.
Figure 6B:
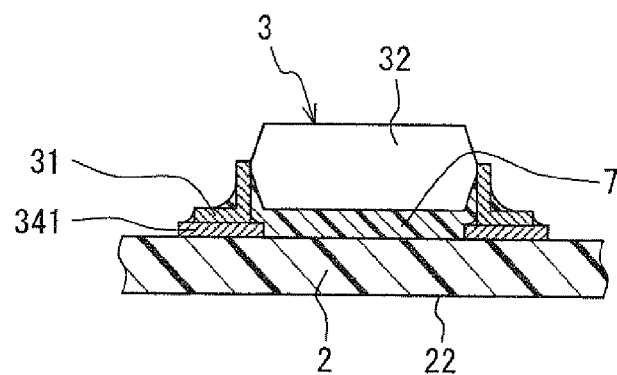
FIG. 6B is a diagram illustrating a cross-sectional view of a curing process of the expelling process of the method of making the electronic key transceiver.
Figure 6C:
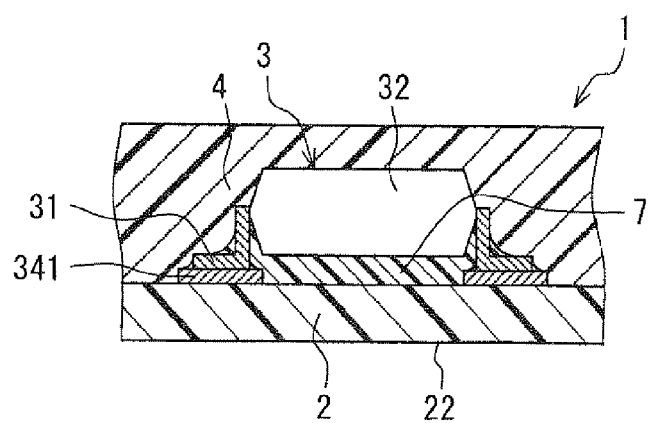
FIG. 6C is a diagram illustrating a cross-sectional view of an electronic element encapsulated in a casing of the electronic key transceiver.

As shown in FIG. 6A, the electronic element 3 includes a housing 32 and a lead terminal 31. For example, the housing 32 can be made of a resin material such as epoxy resin. The electronic element 3 is mounted on the circuit board 2 by electrically connecting the lead terminal 31 to a land 341 joined to the trace pattern of the circuit board 2 through solder or the like. In the injection process of the expelling process, the underfill member 7 is injected into the gap between the circuit board 2 and the electronic element 3 using a dispenser 90 or the like.

The underfill member 7 is a liquid resin material such as epoxy resin. In the embodiment, the underfill member 7 has a viscosity less than a viscosity of the liquid epoxy resin that is injected into the cavity 104 to form the casing 4. That is, the casing 4 and the underfill member 7 can have different viscosities and can be made of different resin materials.

As mentioned previously, the circuit board 2 employs the glass-reinforced epoxy board as the base, and the housing 32 is made of epoxy resin. In such an approach, wettability of the underfill member 7 with respect to each of the circuit board 2 and the electronic element 3 is increased. The underfill member 7 is smoothly injected into the gap between the circuit board 2 and the electronic element 3 and fills the gap. Therefore, it is ensured that air is expelled from the gap.

When the injecting process is finished, the gap between the circuit board 2 and the electronic element 3 is filled with the underfill member 7 as shown in FIG. 5B. In the curing process subsequent to the injection process, heat treatment is applied so that the underfill member 7 in the gap can be cured. As a result, air can remain expelled from the gap. Then, as shown in FIG. 6C, the electronic element 3 is encapsulated in the casing 4 in the encapsulating process described previously.

Alternatively before the underfill member 7 is injected into the gap between the circuit board 2 and the electronic element 3, the circuit board 2 can be preheated. In such an approach, the underfill member 7 can begin to be cured automatically after being injected into the gap.

If air exists in the gap between the circuit board 2 and the electronic element 3, air expands due to heat and pressure in the encapsulating process. The circuit board 2 is softened due to the heat and pressure in the encapsulating process. Therefore, the expanded air can cause a bulge (bump or the like) on the second side 22 of the circuit board 2.

As described above, according to the embodiment, the expelling process is performed prior to the encapsulating process. In the expelling process, the underfill member 7 is injected into the gap between the circuit board 2 and the electronic element 3 so that the gap can be filled with the underfill member 7. In such an approach, it is ensured that air is expelled from the gap. The underfill member 7 injected into the gap is cured so that air can remain expelled from the gap. Therefore, the second side 22 of the circuit board 2 can have no bulge.

The underfill member 7 is in liquid form before being injected into the gap. Therefore, even when the gap is narrow, the underfill member 7 can be easily injected into the gap.

The second side 22 of the circuit board 2 defines the part of the outer surface of the casing 4. In such an approach, the thickness of the electronic key transceiver 1 can be reduced.

The circuit board 2 employs the glass-reinforced epoxy board as the base. In such an approach, the electronic key transceiver 1 can have both stiffness and toughness.

Figure 7A:
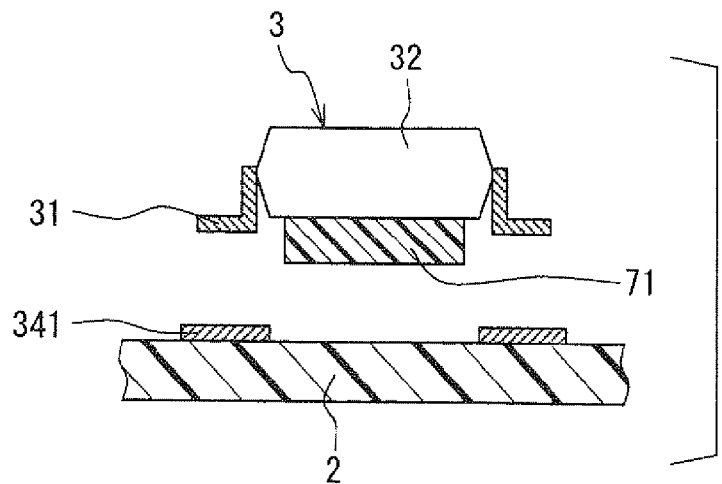
FIGS. 7A-7C are diagrams illustrating cross-sectional views of another expelling process of the method of making the electronic key transceiver.
Figure 7B:
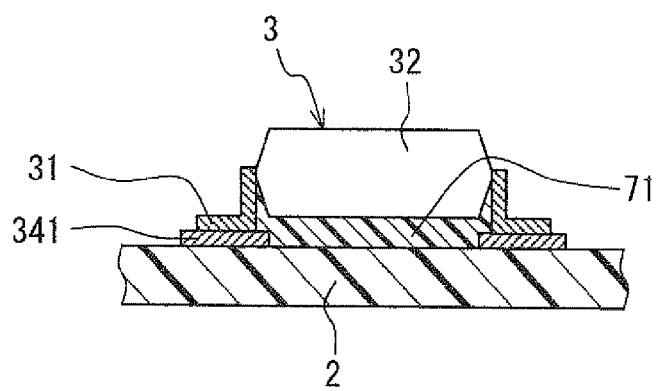
Figure 7C:
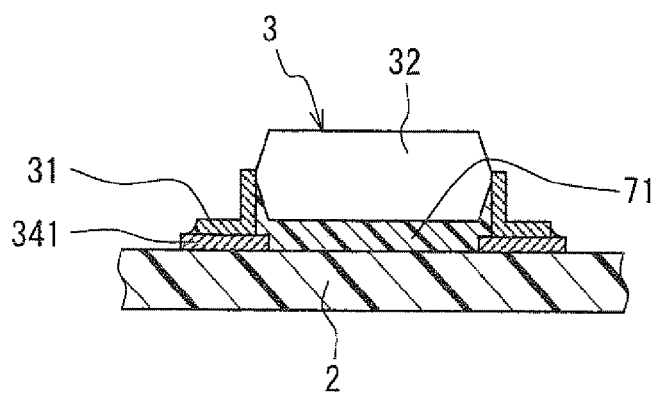

The embodiment described above can be modified in various ways. For example, as shown in FIGS. 7A-7C, air can be expelled from the gap between the circuit board 2 and the electronic element 3 by placing a plastically deformable member 71 in the gap. For example, the plastically deformable member 71 is in solid form and has a thickness slightly greater than the gap. Further, the plastically deformable member 71 can have an adhesion property.

Air is expelled from the gap by using the plastically deformable member 71 as follows. Firstly, as shown in FIG. 7A, the plastically deformable member 71 is bonded to a lower side of the housing 32 of the electronic element 3. Then, as shown in FIG. 7B, the electronic element 3 is pressed against the circuit board 2 in such a matter that the plastically deformable member 71 can be located between the circuit board 2 and the electronic element 3. In such an approach, the plastically deformable member 71 is plastically deformed to fill a gap between the circuit board 2 and the electronic element 3. Therefore, it is ensured that air is expelled from the gap. Then, as shown in FIG. 7C, the lead terminal 31 of the electronic element 3 is soldered to the land 341 of the circuit board 2.

As described above, according to the modification of the embodiment, when the electronic element 3 is mounted on the circuit board 2, the plastically deformable member 71 is placed between the circuit board 2 and the electronic element 3. The plastically deformable member 71 is practically deformed to fill the gap between the circuit board 2 and the electronic element 3 so that air can be expelled from the gap.

The casing 4 can be made by using a molding technique other than a transfer molding technique. For example, the casing 4 can be made by using an injection molding technique, a compression molding technique, or the like.

The electronic key transceiver 1 (i.e., the casing 4) can have a shape other than a card. The present invention can be applied to an electronic circuit device other than an electronic key transceiver.

Such changes and modifications are to be understood as being within the scope of the present invention as defined by the appended claims.

What is claimed is:

1. An electronic circuit device comprising:
a circuit board having first and second sides opposite each other;
an electronic element mounted on only the first side of the circuit board;
a resin casing having a substantially card shape and configured to encapsulate the circuit board and electronic element such that the second side of the circuit board is exposed to an outer surface of the casing to define part of the outer surface of the casing; and
a pre-formed, solid filling member configured to fill a gap between the circuit board and the electronic element,
wherein air is expelled from the gap by the filling member,
wherein the solid filling member is pre-formed from a plastically deformable material that is plastically deformed to fill said gap, having been pressed between the electronic element and the circuit board, and
wherein the filling member is pre-formed by curing a liquid resin material in advance of placement of the pre-formed, solid filling material between the electronic element and the circuit board.

2. The electronic circuit device according to claim 1,
wherein the casing is made of a first resin material, and
wherein the filling member is made of a second resin material.

3. The electronic circuit device according to claim 2,
wherein the first and second resin materials have different viscosities before curing.

4. The electronic circuit device according to claim 1,
wherein a thickness of the pre-formed, solid filling member before being plastically deformed to fill the gap is greater than a width of the gap in a direction perpendicular to the first side and the second side of the circuit board.

* * * * *